US008792588B2

(12) United States Patent
Coersmeier et al.

(10) Patent No.: US 8,792,588 B2
(45) Date of Patent: Jul. 29, 2014

(54) METHOD FOR OPERATING A SOFTWARE RADIO RECEIVER AND SOFTWARE RADIO RECEIVER

(75) Inventors: Edmund Coersmeier, Bochum (DE); Yuhuan Xu, The Hague (NL); Martin Kosakowski, Bochum (DE); Marc Hoffmann, Dinslaken (DE)

(73) Assignee: Nokia Corporation, Espoo (FI)

( * ) Notice: Subject to any disclaimer, the term of this patent is extended or adjusted under 35 U.S.C. 154(b) by 870 days.

(21) Appl. No.: 12/293,369

(22) PCT Filed: Mar. 17, 2006

(86) PCT No.: PCT/IB2006/000595
§ 371 (c)(1),
(2), (4) Date: Nov. 19, 2008

(87) PCT Pub. No.: WO2007/107805
PCT Pub. Date: Sep. 27, 2007

(65) Prior Publication Data
US 2009/0074112 A1    Mar. 19, 2009

(51) Int. Cl.
*H03K 9/00*  (2006.01)
*H04L 27/06*  (2006.01)

(52) U.S. Cl.
USPC ............ 375/316; 375/341; 375/140; 375/147

(58) Field of Classification Search
USPC .......................... 375/316, 147, 136, 341, 140
See application file for complete search history.

(56) References Cited

U.S. PATENT DOCUMENTS 6,167,246 A * 12/2000 Elder et al. .................... 455/313
6,188,679 B1 * 2/2001 Sato .............................. 370/335
6,792,258 B1 * 9/2004 Nokes et al. ................ 455/277.2
7,184,741 B2 * 2/2007 Elder et al. .................... 455/333
7,409,205 B2 * 8/2008 Mittal .......................... 455/414.1
7,962,117 B2 * 6/2011 Elder et al. .................... 455/333

OTHER PUBLICATIONS

Jackson, Peter; EBU Technical Review; Jan. 2003; VT Merlin Communications, UK; pp. 1-11.*
Jeanette F. Arrigo, Kevin J. Page, Yuhe Wang, Paul M. Chau, Adaptive FEC on a Reconfigurable Processor for Wireless Multimedia Communications, *IEEE* part 3.2, pp. 417-420, 1998.
C. Chaikalis, M. Alimi-Khaligh, N. Panayotopoulos, J.M. Noras, Reconfiguration Between Soft Output Viterbi and Log Maximum a Posteriori Decoding Algorithms, *3G Mobile Communication Technologies*, Conference Publication No. 471, IEE, pp. 316-320, 2000.
Chih-Seng Chou, David W. Lin, Training Sequence and Memory Length Selection for Space-Time Viterbi Equalization, *Journal of Communications and Networks*, vol. 2, No. 4, pp. 361-366, Dec. 2000.
Chia-Han Lee, Wayne Wolf, Energy/Power Estimation for LDPC Decoders in Software Radio Systems, *IEEE*, pp. 48-53, 2005.
PCT/US2006/000595 International Search Report, dated Dec. 28, 2006.
PCT/US2006/000595 Written Opinion, dated Dec. 28, 2006.
PCT/US2006/000595 Written Opinion, dated Apr. 30, 2008.
PCT/US2006/000595 International Preliminary Report on Patentability dated Jul. 21, 2008.

* cited by examiner

*Primary Examiner* — Qutbuddin Ghulamali
(74) *Attorney, Agent, or Firm* — Alston & Bird LLP

(57) ABSTRACT

The present invention disclosed a method for operating a software radio receiver. Said method comprises receiving a radio signal, determining a signal quality of said radio signal, selecting a suitable algorithm for a function in the receiver in accordance with said determined signal quality and applying said selected algorithm to the radio signal.

26 Claims, 4 Drawing Sheets

METHOD FOR OPERATING A SOFTWARE RADIO RECEIVER AND SOFTWARE RADIO RECEIVER

CROSS REFERENCE TO RELATED APPLICATION

This application claims the priority of the international application published under the international publication number WO 2007/107805 A1.

BACKGROUND OF THE PRESENT INVENTION

1. Field of the Invention

The invention report is related to power saving in software radio receivers and mobile software radio receivers. The present invention pertains to a method for operating a software radio receiver for reducing the power consumption of software radio receivers by dynamic channel decoding based on required decoding performance and a software radio device capable of operating according to said method.

2. Description of the Related Art

The term software radio describes an implementation of a radio which may be a transceiver, receiver or transmitter or any device that has receiving or transmitting capability, in which a large proportion of the signal processing is performed and controlled by software. For example in a receiver, the antenna signal is preferably filtered, sampled and directly A/D-converted in order to make it available for digital signal processing. Typical stages that are conventionally done in the analogue domain are performed by software on a processor, like frequency conversion, mixing and/or filtering. A similar structure is applied to a transmitter or the transmitting path of a transceiver.

The present invention further pertains to the field 3G Evolution Technologies (3GET) involving Orthogonal Frequency Division Multiplexing (OFDM) transmissions. More specifically the present invention pertains to the Broadcast technology known as Digital Radio Mondiale (DRM) that may be implemented as software radio. 3.9G is the next generation for cellular networks. DRM is an emerging broadcast technology aimed as a long-term replacement of current analogue amplitude modulated (AM) radio. DRM provides huge benefits in audio quality over analogue AM radio while preserving the high transmission range typical for AM radio. DRM may also provide enhanced broadcast data services, which may not be provided by AM radio.

This capability of providing good audio quality in a long range broadcast system is based on the use of algorithms capable of repairing/compensating transmission errors. One of the known error correction algorithms is e.g. the Viterbi algorithm that is capable of providing a highly sophisticated recognition/repair capabilities. However, the Viterbi algorithm has the drawback that it requires a high amount of processing power and in turn requires a high amount of electric power consumption. Especially in the field of mobile software radio receivers, the high power consumption would significantly reduce the operation time of a battery powered mobile software radio receiver. Especially, in case of mobile software radio receivers that are used in highly varying signal quality conditions, the use of a Viterbi algorithm may significantly restrict the operation time of a mobile software radio receiver. Especially, in case of mobile software radio receivers that are used in highly varying signal quality conditions, the use of a Viterbi algorithm may be a prerequisite for enabling the operation of a mobile software radio receiver, especially in case of fading signal conditions caused by multiple reflections.

The technical background for different coding schemes may be found in "Trelliscodierung", by J. Huber, Springer, 1992, ISBN 3-540-55792-X. Another document related to radio transmission decoding is disclosed in "A Novel Method for Convolutional Decoding Using Recurrent Neural Networks", by Arto Rantala, VTT Electronics.

The use of DRM in mobile software radio devices is a kind of quandary: on one hand, the mobile software radio receiver requires a high processing power to compensate for varying reception or signal conditions, and on the other hand, the power consuming compensation algorithms reduce the operation time significantly so that a mobile operation is in turn restricted. The device has to be able to cope with bad signal conditions therefore the algorithms were designed for the worst case scenario, and in case of better than worst case, the algorithm performance is over specified and requires much power.

BRIEF SUMMARY OF THE INVENTION

It is desirable to overcome this quandary to enable a mobile or portable device capable of operating for longer periods even under changing signal/reception conditions.

It is desirable to reduce significantly the power consumption in a mobile software receiver, especially for channel or DRM decoding which consumes much of the overall power consumption of such a device.

The present invention provides a software radio receiver and a method to operate such a receiver, capable of performing mobile or portable operation of a mobile software radio receiver.

According to a first aspect of the present invention a method for operating a software radio receiver is provided. The method comprises receiving and, determining a signal quality of said received signal, selecting a suitable algorithm for a function in the receiver in accordance with said determined signal quality and applying said selected algorithm to said radio signal.

The determining of said signal quality of said radio signal is performed continuously or at least repeatedly. It may also be possible to employ an algorithm to adapt the intervals of this determination to the history of determined qualities of said radio signal. Thus, it may be envisaged to use also an adaptive algorithm to control the surveillance of the incoming radio signal to also be able to economize the power spend for optimizing the signal processing.

The idea of the invention report is to reduce the power consumption in a software radio receiver by using always an algorithm that gives a sufficient performance for decoding the radio signal. This idea is based on the observation that the algorithms that give the best performance in decoding error correction are also those that are the most complex and therefore need the most calculation steps.

A main aspect of the present invention is that the processing power used to clearly decode, repair and/or correct a received signal is adapted to the quality of the received signal.

In another example embodiment of the present invention said algorithm is a decoding algorithm. This implementation can be applied especially in case that the software radio receiver is provided with a software decoder capable of decoding with a high fault tolerance to be able to compensate signal fading as in case of mobile software radio receivers under multi-path reflection conditions. In this embodiment, the function in the receiver said suitable algorithm is provided for is decoding the radio signal. This embodiment of the method of the present invention further comprises decoding the received radio signal to a (digital) data or audio signal.

In yet another example embodiment of the present invention said applying said selected algorithm to the radio signal comprises decoding said radio signal. This embodiment is used to emphasize that the present invention may be used especially for performing a single task (i.e. decoding) with different algorithms in accordance with a determined signal quality.

In yet another example embodiment of the present invention said algorithm is an error correction algorithm. This implementation can be applied if a signal correction of e.g. a digital radio signal may be performed independently from the decoding of the signal. In this embodiment, the function in the receiver said suitable algorithm is provided for is error correction of the received radio signal.

This embodiment is explicitly used to show that the error correction algorithms and the step of decoding the corrected signal may also be performed in two different steps. However, it is also possible to combine the error correction algorithms and the decoding algorithms in error correcting decoding algorithms.

In still another example embodiment of the present invention said radio signal is a digital radio mondiale signal. This implementation is provided to cover especially the use of the method of the present invention in digital radio mondiale receivers and in mobile digital radio mondiale receivers.

In an example embodiment of the present invention said determined signal quality comprises the signal-to-noise-ratio of said received radio signal. The signal-to-noise-ratio of a received signal is a value that may easily be determined by using conventional signal processing technologies. The signal-to-noise-ratio may be determined for any kind of signal such as analogue or digital signals.

In another example embodiment of the present invention, said determined signal quality comprises a Channel State Information (CSI) of said received radio signal. The CSI represents information for each of the channels of the multi-channel transmission.

In yet another example embodiment of the present invention, said suitable algorithm for a function in the receiver is scalable, and said algorithm is applied in accordance with said determined signal quality, by scaling said algorithm in accordance with said determined signal quality. In this case, the error correction and/or decoding algorithm is applied in accordance with said determined a signal quality. This embodiment may also be construed as the case in which each different scale of an algorithm is considered as a different algorithm. Wherein in this case suitably scaled algorithm is selected to decode (or error correct) said received radio signal.

One of the known error correction algorithms is e.g. the Viterbi algorithm. The Viterbi algorithm stores "survivor paths" of the state histogram (Trellis) wherein the length of the stored survivor paths is directly related to the error correction capabilities and the required (calculation) power consumption. In this embodiment in case of a good signal to noise ratio (in all channels) the path length of the Viterbi algorithm may be decreased. In case of bad signal to noise ratio in (at least one of the channels) the path length of the Viterbi algorithm may be increased to be able to guarantee a sufficient bit error rate. Especially in case of mobile software radio receivers that are used in highly varying signal quality conditions, the use of a quickly scalable Viterbi algorithm may increase significantly the operation time of software radio receiver. However, the scalability should be able to accommodate even highly varying signal quality conditions to be able to operate the device even in case of fading signal conditions caused by multiple reflections.

In still another example embodiment of the present invention that said suitable algorithm is selected from a number of different algorithms with different processing qualities, properties, capabilities and/or power consumptions. Especially the combination of different processing qualities and power consumptions make it possible to weigh power consumption against the required (decoding or error correcting) quality of the algorithm in question.

In a simple embodiment, this may be implemented by turning off e.g. an error correction algorithm in case of excellent transmission conditions. It is also contemplated to use e.g. a Viterbi algorithm in combination with another suitable algorithm for a function in the receiver such as Trellis algorithm, Turbo (code) algorithms, BCJR algorithm 3, LDPC Codes and Gallager's decoding algorithms. It may be noted that in the invention it may not be possible to clearly differentiate between decoding and error correction algorithms, as e.g. the Viterbi algorithm may perform both components in a single algorithm. Anyhow, as the transmitter of the data uses always the same coding and transmission method, the decoding (even though implemented differently) has to provide identical or at least similar results, depending on the error tolerance of the recipient (user or receiving application). This means, that the decoding is always performed in a similar manner which means that only the error correction components of a decoding algorithm provide any differences. That is, the decoding i.e. the transfer of the received digital signal to a data stream or an audio signal has to be at least similar or identical depending on the transmission/reception conditions.

This may be implemented e.g. by turning off the error correction capabilities of the suitable algorithm for a function in the receiver in case of "perfect" transmission conditions (i.e. an excellent signal to noise ratio in all channels and an excellent CSI). It is also envisaged to employ a Viterbi algorithm in combination with another error correction algorithm such as Trellis algorithm, Turbo (code) algorithms, BCJR algorithm 3, LDPC Codes and Gallager's decoding algorithms, wherein each algorithm is selected according to the detected signal quality and the required power consumption. An optimally adjusted implementation would select the algorithm with the least power consumption that is capable of providing a data stream or an audio signal that a user would perceive as "sufficient". A sufficient reception can be measured by e.g. setting a certain bit error rate, e.g. 10−3 or 10−5. However, a sufficient reception can also be defined by a user score of e.g. an audio or a video signal.

Depending on the actual transmission channel quality, which is visible through e.g. the signal-noise-ratio (SNR) and/or the Channel State Information (CSI), the receiver should check continuously whether all possible mathematical operations in the receiver are really required for the current transmission situation. In one case of bad channel conditions, all available digital processing power is required to recover the transmitted signal.

Typically, the best algorithms are the most power hungry algorithms when they are implemented in e.g. DSP (Digital Signal Processing) software. However, it is not always necessary to use the "best" algorithm.

If the reception conditions are good (e.g. as measured by a high S/N-ratio), then a less complex algorithm will be able to decode the input signal sufficiently, even though this algorithm may not give a sufficient performance under low S/N-ratio conditions.

In case of better or very good channel conditions the radio receiver switches off processing power hungry algorithms and runs algorithms with reduced complexity, which require less computational effort and therefore have on the one hand less performance but also lower power consumption. Under these conditions, the algorithms with reduced complexity and low power consumption may be sufficient to decode the signal with the required quality.

In still another example embodiment of the present invention the method further comprises sending said decoded radio signal via a short range communication channel (e.g. Bluetooth) to another device (such as e.g. an audio playback device in case of a decoded audio signal). In a simple embodiment of a radio broadcast software receiver the digital audio signal may be sent e.g. via Bluetooth to an amplifier and speaker unit for playing back said digital audio signal. It is also envisaged to transfer also additional data such as e.g. RDS (Radio Data System) like information concerning e.g. the actual program, the broadcast station, events or traffic information in the broadcast transmission to the reproducing device or playback device. It is also envisaged to receive transmit radio receiver control commands to remotely control the transceiver via said short range communication channel. It is also possible to use e.g. WLAN (Wireless Local Area Network) or near field communication for the transfer of the digital audio signal.

According to yet another aspect of the invention, a software tool is provided comprising program code means for carrying out the method of the preceding description when said program product is run on a software radio device.

According to another aspect of the present invention, a computer program product downloadable from a server for carrying out the method of the preceding description is provided, which comprises program code means for performing all of the steps of the preceding methods when said program is run on a software radio device.

According to yet another aspect of the invention, a computer program product is provided comprising program code means stored on a computer readable medium for carrying out the methods of the preceding description, when said program product is run on a computer or a network device.

According to another aspect of the present invention a computer data signal is provided. The computer data signal is embodied in a carrier wave and represents a program that makes the computer perform the steps of the method contained in the preceding description, when said computer program is run on a computer, or a network device.

According to still another aspect of the present invention a software radio receiver is provided. According to the invention the software radio receiver comprises at least a reception unit, a signal quality determining stage, an algorithm selection stage and an algorithm application stage.

The reception unit is provided for receiving a radio signal. The reception unit, receiver unit, or signal reception component may be embodied in the simplest case an antenna, and may in more sophisticated embodiments also comprise filters, amplifiers converters, gain control components and an A/D converter and the like.

The signal quality determining stage is connected to said reception unit. The signal quality determining stage is provided for determining the signal quality of said incoming radio signal. The present invention also pertains to radio broadcast receivers and therefore the device has to determine this value on the basis of the received signals (and not on the basis of e.g. received data).

The algorithm selection stage is connected to said signal quality determining stage. The algorithm selection stage is provided for selecting an algorithm for a function in the receiver that is to be applied to said received radio signal.

The algorithm application stage is, connected to said reception unit and to algorithm selection stage. The algorithm application stage is provided for applying said selected algorithm for a function in the receiver to said received radio signal. The algorithm application stage uses selected algorithm according to a respective signal received from said algorithm selection stage (in accordance with said determined signal quality).

It may be noted that especially the signal quality determining stage, algorithm selection stage and the algorithm application stage may be embodied as software implementations that are executed on a respective versatile integrated circuit.

The idea of the invention is to reduce the power consumption in a software radio by using always a sufficient algorithm for decoding the radio signal or for error correcting an incoming or received radio signal. It should further be mentioned that the device may also comprise an algorithm application stage with combined decoder and error correction capabilities. The algorithm application stage may be implemented in a Viterbi decoder, capable of correcting errors even in mutilated or truncated signals or code. That is, in the context of the present invention even decoding algorithms are considered as error correcting algorithms (even if they perform additional procedures such as decoding) as long as the decoder actually has any kind of error correcting capability.

The mobile software radio receiver may further comprise an antenna connected to said reception unit, a battery for powering the device, a user input interface, different amplifiers, an audio, information output and input interfaces (i.e. loudspeakers, display, keyboards and the like) and a housing for encapsulating these components. It is also envisaged to provide the mobile software radio receiver with digital/analogue converters or with analogue/digital converters to enable the device to directly output audio information.

In another example embodiment of the present invention where in said algorithm for a function in the receiver is a decoding algorithm.

In still another example embodiment of the present invention where in said algorithm for a function in the receiver is an error correction algorithm.

In still another example embodiment of the present invention said software radio receiver further comprises an algorithm storage connected to said algorithm application stage, for storing a number of different algorithms with different processing properties and for selecting a suitable algorithm to be executed at said algorithm application stage from. It is also envisaged to connect said algorithm storage to said algorithm application stage, to enable a direct download originating from the algorithm storage to the said algorithm application stage, to speed up a possible reselection or change of the suitable algorithms.

In just another example embodiment of the present invention said software radio receiver is a digital radio mondiale receiver.

In an example embodiment of the present invention said signal quality determining stage determines a signal-to-noise-ratio of said received radio signal, as signal quality. This may e.g. by example be performed for a single channel or for a number of channels in case of multi-channel radio transfers such as in the case multi-channel broadcast radio transmissions such as stereo or 5.1 surround sound broadcast.

In just another example embodiment of the present invention said signal quality determining stage determines a Channel State Information (CSI) of said received radio signal.

In yet another example embodiment of the present invention, said algorithm application stage uses a scalable algorithm. In this case the scale of said scalable algorithm is selected in accordance with said determined signal quality. When said algorithm application stage is implemented in a signal decoding stage, (using e.g. a Viterbi algorithm) the decoding algorithm is scalable, and the decoding algorithm is scaled in accordance with said determined signal quality.

In still another example embodiment of the present invention, said algorithm application stage uses different error correction algorithms according to said determined signal quality. That is (in case the algorithm application stage uses a decoder stage and a error correction stage) the scalable Viterbi decoder is used e.g. in case of bad signal condition while e.g. a Trelly decoder may be used in case of a better signal condition.

In yet another example embodiment of the present invention, said software radio receiver further comprises a decoder to decode said received radio signal to a digital data or audio signal. All above embodiments may be implemented as devices having an algorithm application stage for providing the functions of an error correction stage and a decoder stage. All above embodiments may be implemented as devices wherein the error correction stage is implemented in the decoder stage. All above embodiments could also have been implemented as a kind of digital signal pre-processing stage of a receiver, as the decoding step was not necessarily provided. In the present embodiment the output signal is expected to be a digital audio or video signal.

In still another example embodiment of the present invention, said software radio receiver is also provided with a short range communication transceiver. The transceiver is connected to said decoder and is provided for sending a decoded radio signal (such as a data or e.g. an audio signal) via a short range communication channel (such as e.g. Bluetooth) to a device such as e.g. an audio playback device (such as a mobile telephone, a car radio, an active speaker system or wireless headphone).

In just another example embodiment of the present invention said software radio receiver further comprises a mobile telephone. It would better be implemented as mobile (cellular) telephone comprising a software radio receiver as disclosed in the preceding description.

BRIEF DESCRIPTION OF THE SEVERAL VIEWS OF THE DRAWINGS

In the following, the invention will be described in detail by referring to the enclosed drawings in which.

DETAILED DESCRIPTION OF THE INVENTION

Figure 1:
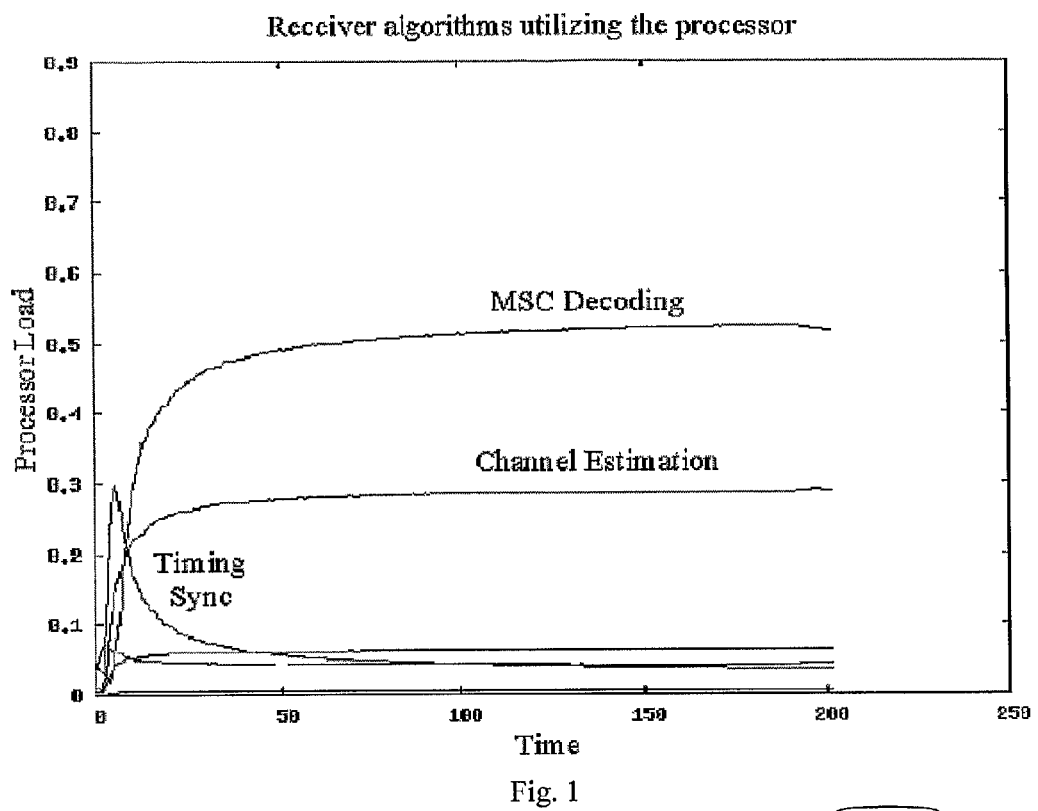
FIG. 1 is a diagram showing how different receiver algorithms cause different processor load to a processor.

In the detailed description which follows, identical components have been given the same reference numerals, regardless of whether they are shown in different embodiments of the present invention. In order to clearly and concisely illustrate the present invention, the drawings may not necessarily be to scale and certain features may be shown in somewhat schematic form.

FIG. 1 is a diagram showing how different receiver algorithms cause different processor load to a processor. In the example, it becomes clear that the power consumption of MSC decoding (in this case MPEG4 decoder) algorithm has the highest power consumption, followed by the channel decoder.

Figure 2:
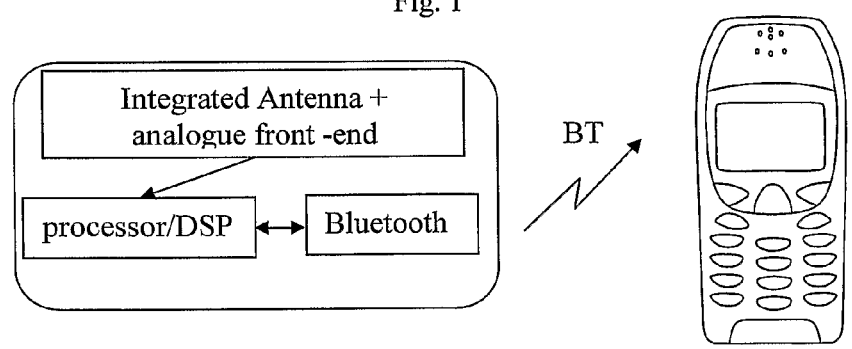
FIG. 2 shows a processor-based software radio receiver, FIG. 3 provides a description of one possible implementation of the present invention.

FIG. 2 shows a processor-based software radio receiver. Preferably, the processor is a DSP, e.g. based on the OMAP™ platform, or any other processor suited to perform signal processing tasks. In this implementation the software radio receiver is implemented as an additional device for a mobile phone depicted on the right side. The software radio receiver comprises an integrated antenna and an analogue front end (or reception unit) (including e.g. an analogue filters analogue amplifiers and the like). The analogue front end is connected to a processor/DSP unit for performing digital signal processing and for controlling the software radio receiver. In this component a data signal is extracted from the received radio signal. The extracted data signal may be a digital audio signal, which may be transmitted e.g. via a short range radio connection to an audio playback device such as an active loudspeaker system having a radio input (or the depicted mobile telephone).

Figure 3:
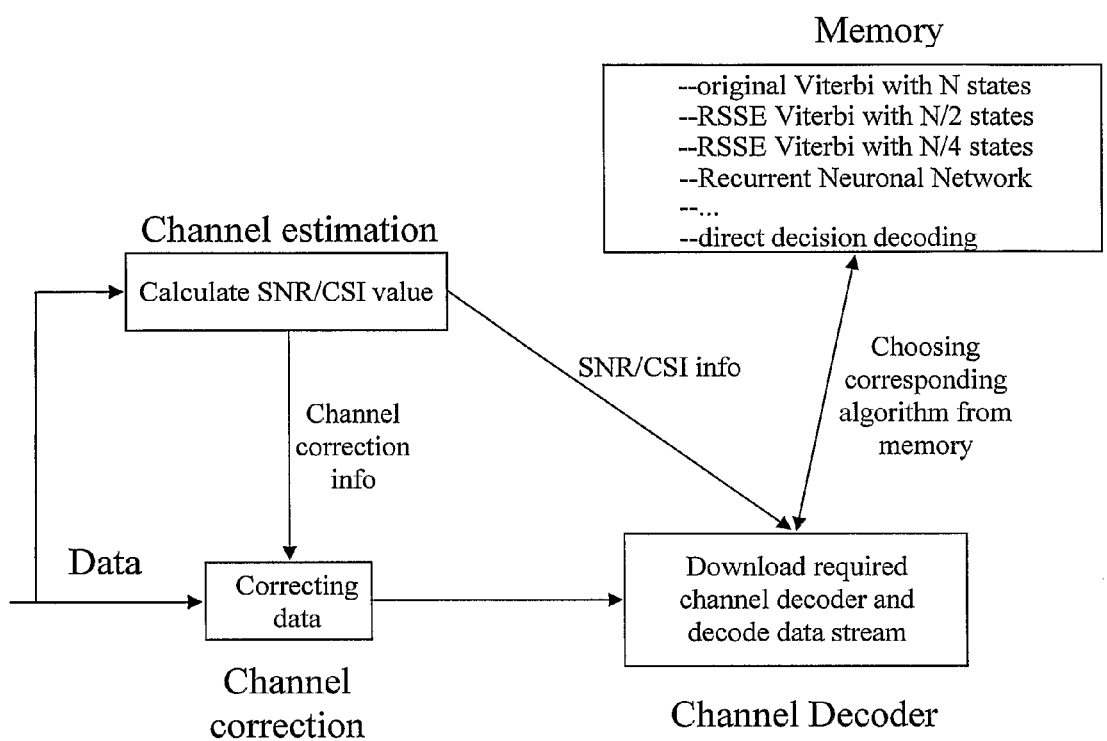

FIG. 3 provides a description of one possible implementation of the present invention. From the left side of a received incoming radio signal is indicated by the signal lines labeled "data". The channel estimation algorithm provides SNR & CSI estimate values. This information is delivered to the channel decoder block, which chooses the corresponding channel decoder algorithm (which also includes the error correction algorithms) from the memory.

Several different channel decoders are stored in the memory. A fully variable, single code implementation might provide too much processing overhead for efficient decoding. Thus, different algorithms are stored instead of one flexible design. But this depends on the code parameters like code rate and constraint length.

Figure 4:
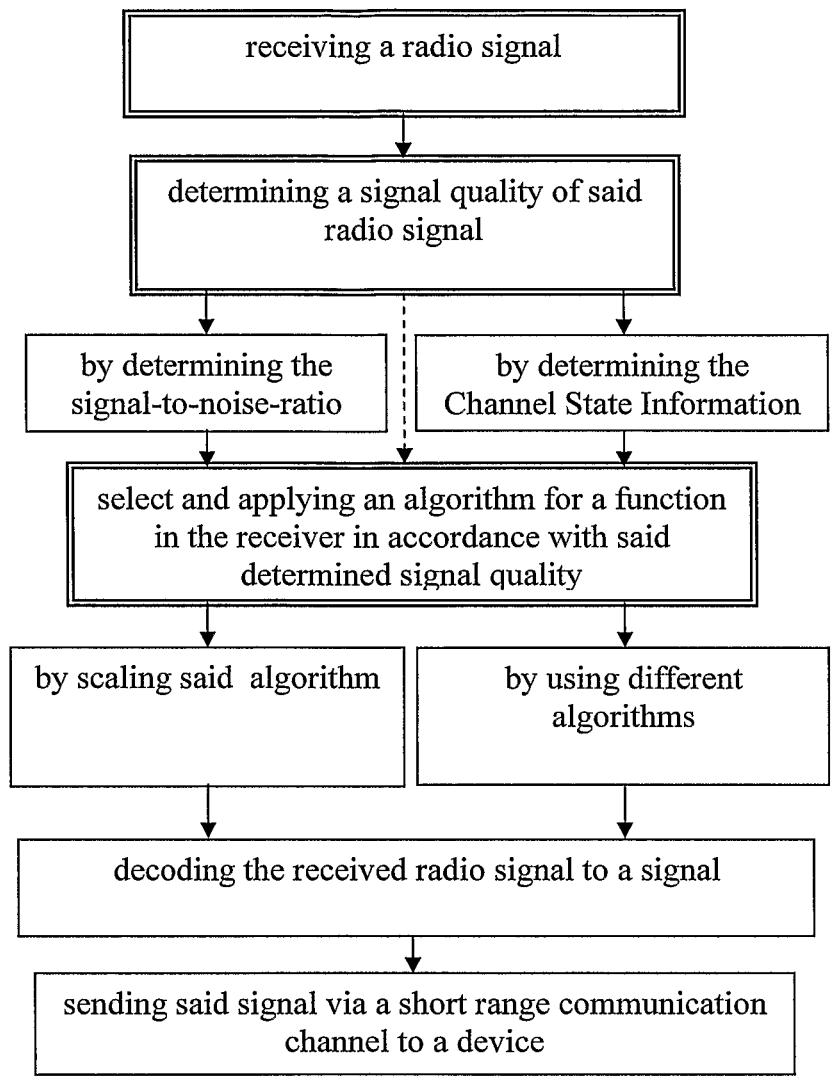
FIG. 4 depicts a flowchart of the present invention.

FIG. 4 depicts a flowchart of the present invention. The basic components are depicted in boxes in double lines. The invention proposes to employ different channel decoder mechanisms for different channel conditions.

The flowchart starts with receiving a radio signal. From the radio signal a quality (value or measure) is determined. This determination may be performed by determining the signal-to-noise ratio, or by determining the Channel State Information (as e.g. defined in the DRM standard).

Then an algorithm for a function in the receiver is selected and applied in accordance with said determined signal quality.

This selecting of an algorithm for a function in the receiver may be achieved by scaling (or selecting a scale of) a scalable algorithm, which is then applied to the received radio signal.

This selecting of an algorithm for a function in the receiver may also be achieved by selecting one of a number of different types of algorithms, wherein the selected one is then applied to the received radio signal.

When the decoding has not been performed during the error and correction stage, the decoding of the signal may be performed in a successive step to obtain a digital data signal, e.g. a digital audio signal. It is also possible to use a decoding algorithm as another function in the receiver that is also be selected in accordance with the detected radio signal quality.

It is optionally possible to provide, store or send said digital audio signal to a playback device e.g. via terminal or a short range communication link or channel.

The decision, which channel decoder mechanism (with witch error correction capabilities) shall be used, is done by interpreting the channel conditions before the channel decoding (with witch error correction algorithms) starts. The better the channel is, the less complex the channel decoder (and its capabilities to cope with erroneous signals) needs to be.

One of the most processing power hungry algorithms in many OFDM radio receivers is for example Viterbi/Turbo channel decoder. In case of DRIVE using long constraint length (e.g. 7), high code rates (e.g. ¼) and various derivatives, like e.g. puncturing, the code offers strong signal recovery properties, but requires a complex Add-Compare-Select (ACS) and Path-Metric-Unit (PMU). In case of a constraint length of 7, there are 64 states and thus 32 butterflies with a terminated search path length of e.g. 1024 bits. The Viterbi decoder improves the SNR for about 10 dB at 1e-4 BER compared to direct decision algorithm (1e-4 is working point for DRM).

A Reduced-State-Sequence-Estimator (RSSE) as described e.g. in the literature listed in the beginning of this description provides a reduced complexity Viterbi algorithm, which employs e.g. half of the butterflies and down to nearly about 50% less processing power, depending on the processor (within a DSP environment processing power is reduced to about 25%). The performance loss is at the same time only about 2 dB at 1-e4 BER. Thus the RSSE is advantageous in terms of power consumption and disadvantageous in terms of performance compared to the original Viterbi algorithm.

Returning to the example of a DRM receiver, a minimum SNR of 16 dB is typically required to achieve an acceptable performance. SNR values in-between 16-27 dB are usual in normal DRM operation mode. Values above 27 dB are possible but very seldom in practice. Thus a dynamic channel decoding strategy leads to the following setup:

| | |
|---|---|
| 16-20 dB SNR | original Viterbi is active, because strong channel decoding performance required |
| 20-30 dB SNR | RSSE power reduced Viterbi active, because 2 dB performance loss are acceptable while 25%-50% power reduction can be achieved. |
| 30-infinity dB SNR | direct decision active, because channel provides nearly no imperfections. The power consumption of direct decision is very low. |

SNR estimates and Channel State Information (CSI) can be calculated before channel decoding by channel estimation algorithm. The SNR & CSI values contain beside the noise any other remaining, not removed channel imperfection like multi-path propagation, Doppler spread or analogue front-end imperfections. All imperfections can be summed up in SNR & CSI values, which describe the overall residual channel condition after channel correction has been activated.

In case of RSSE a variable J describes the complexity reduction factor. The reduction can be done seamlessly with J=2, 4, 6 . . . . The reduction ends when the Viterbi has been reduced to a direct decision approach. Thus the invention can be formulated more generally:

Channel decoder Complexity=Viterbi Complexity/J and J=function (SNR and CSI) with J=2, 4, 6 . . . . Thus the required processing power is a function of the actual channel SNR and CSI values.

Besides the RSSE algorithm, further approaches like Recurrent Neural Networks can be used to reduce the receiver power consumption for channel decoding.

Figure 5:
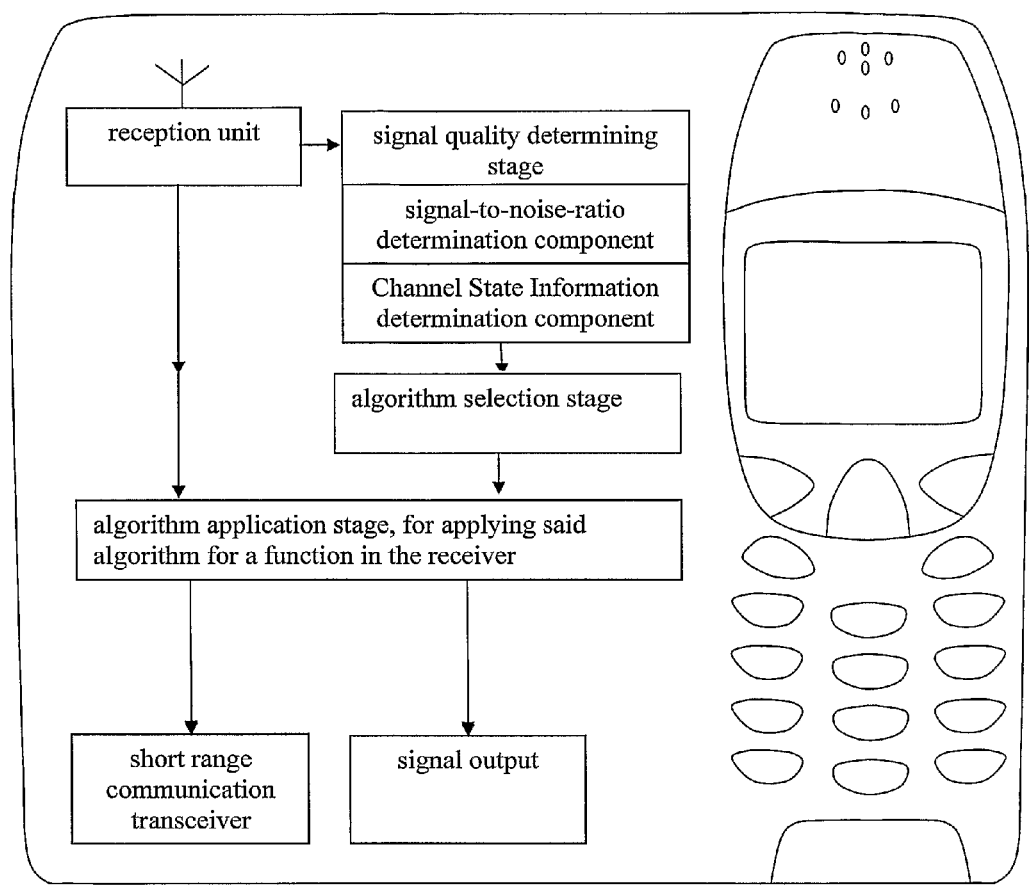
FIG. 5 depicts an embodiment of a software radio receiver integrated into a mobile telephone.

FIG. 5 shows an embodiment of a software radio receiver integrated into a mobile telephone.

In contrast to the implementation of FIG. 3 the software radio receiver of FIG. 5 shows two separated components for the algorithm selection stage, (connected to said signal quality determining stage) and for the algorithm application stage, (connected to said reception unit and to algorithm selection stage).

In FIG. 5 the mobile radio receiver is implemented as a digital radio mondiale broadcast receiver wherein the power consumption of which should be as low as possible.

In a mobile radio receiver the power consumption should be as low as possible. This may be achieved via optimized implementations (e.g. ASIC). This may also be achieved according to the present invention (in case of software radio) by applying low power algorithms. Different to ASIC solutions, the implemented software radio algorithms can be changed on the fly and thus a higher flexibility in terms of processing power vs. algorithm performance is possible.

Depending on the actual channel quality, which is visible through the Channel State Information (CSI), the receiver should check continuously whether all possible mathematical operations in the receiver are really required for the current transmission situation. In case of bad channel conditions all available digital processing power is required to recover the transmitted signal. That is the worst case.

In case of better or very good channel conditions the radio receiver switches off processing power hungry algorithms and runs algorithms with reduced complexity, which require less computational effort and therefore have on the one hand less performance but also lower power consumption. Under these conditions, the algorithms with reduced complexity and low power consumption may be sufficient to decode the signal with the required quality.

For pure ASIC implementations this approach is not very advantageous, because one needs to implement different algorithms in parallel. This leads to a higher gate count and finally to a high chip price. But a software radio approach itself supports flexible implementation and thus is an optimal platform for dynamic algorithm employment.

The Mobile digital radio mondiale software broadcast receiver comprises a reception unit with an antenna to receive a digital radio mondiale broadcast signal. The signal is split up and forwarded to a signal quality determining stage and to an error correction stage In the signal quality determining stage, that comprises a signal-to-noise-ratio determination component and a Channel State Information determination component, information about the expected signal quality can be determined. A determined parameter, value or measure or the signal quality is forwarded to the algorithm selection stage.

The algorithm selection stage is provided to "translate" the detected signal quality value into an algorithm to be applied to the respective received radio signal. The algorithm selection stage is connected to the algorithm application stage for applying the selected algorithm for a function of the receiver. According to the value of e.g. the signal-to-noise ratio received from the signal quality determining stage, the algorithm selection stage informs the algorithm application stage which algorithm is to be applied.

At the algorithm application stage (which may be implemented e.g. as a combined correction, repair and decoder stage), the algorithm selected by the algorithm selection stage is applied to the received radio signal. It is possible to implement an error correction capability in the algorithm application stage. The algorithm application stage can comprise a decoder with scalable error correction decoding and decoding algorithms. It should be noted that even a decoding algorithm with no correction capabilities may be considered as an error correction decoding algorithm just without any correction capabilities. Similarly, it is possible to employ no error correction algorithm if e.g. the signal quality is good enough.

The output of the algorithm application stage (here an error correction and decoding stage) is a digital (not necessarily binary but just discrete) data signal, that may be transferred to a short range communication transceiver or to an audio output for playing back the audio signal at the device or via a connected playback device (not depicted). The mobile digital radio mondiale software broadcast receiver is integrated in a mobile telephone. To not obscure the figure and the interface and control elements enabling a user to control the mobile digital radio mondiale software broadcast receiver via the user interface, elements of the mobile telephone are not depicted (even though such connections and control elements are to be provided in the telephone).

The present invention provides the advantages of a dynamic channel decoder optimization in terms of performance versus power consumption, which results in an increased battery life, which can be achieved by an increased memory requirement for storing the different algorithms.

It may also be possible to integrate DRM capabilities into portable and mobile software radio devices. This invention can be applied for different radios, broadcast receivers, especially for OFDM technologies. The device of the present invention changes its power consumption depending on the channel properties.

This application contains the description of implementations and embodiments of the present invention with the help of examples. It will be appreciated by a person skilled in the art that the present invention is not restricted to details of the embodiments presented above, and that the invention can also be implemented in another form without deviating from the characteristics of the invention. The embodiments presented above should be considered illustrative, but not restricting. Thus the possibilities of implementing and using the invention are only restricted by the enclosed claims. Consequently various options of implementing the invention as determined by the claims, including equivalent implementations, also belong to the scope of the invention.

The invention claimed is:

1. A method for operating a software digital radio mondiale broadcast receiver said method comprising:
   receiving a digital radio mondiale broadcast signal, said digital radio mondiale broadcast signal being in accordance with the digital radio mondiale standard;
   determining at said digital radio mondiale broadcast receiver a signal quality of said received digital radio mondiale broadcast signal;
   selecting a suitable algorithm for a function in the receiver in accordance with said determined signal quality; and
   applying said selected algorithm to the received digital radio mondiale broadcast signal, wherein said selected algorithm is scalable, and wherein said algorithm is applied in accordance with said determined signal quality, by scaling said algorithm in accordance with said determined signal quality,
   wherein the algorithm comprises a decoding algorithm and said received digital radio mondiale broadcast signal is always coded with the same coding method, wherein the decoding provides identical decoding results or at least similar decoding results within an error tolerance of the digital radio mondiale broadcast receiver.

2. Method according to claim 1, wherein said applying said selected algorithm to the digital radio mondiale broadcast signal comprises decoding said digital radio mondiale broadcast signal.

3. Method according to claim 1, characterized in that said algorithm is an error correction algorithm.

4. Method according to claim 1, characterized in that said determined signal quality comprises a signal-to-noise-ratio of said received digital radio mondiale broadcast signal.

5. Method according to claim 1, characterized in that said determined signal quality comprises a Channel State Information of said received digital radio mondiale broadcast signal.

6. Method according to claim 1, wherein said decoding algorithm decodes said received digital radio mondiale broadcast signal, wherein said method further comprises sending said decoded digital radio mondiale broadcast signal via a short range communication channel to another device.

7. The method according to claim 1, wherein the algorithm is further selected in accordance with a required power consumption.

8. The method according to claim 1, characterized in that the algorithm is selected in accordance with said determined signal quality from different algorithms having different processing qualities.

9. A digital radio mondiale broadcast receiver, comprising program code sections stored on a non-transitory machine-readable medium for
   causing a digital radio mondiale broadcast receiver to receive a digital radio mondiale broadcast signal, said digital radio mondiale broadcast signal being in accordance with the digital radio mondiale standard;
   causing a digital radio mondiale broadcast receiver to determine a signal quality of said received digital radio mondiale broadcast signal;
   causing a digital radio mondiale broadcast receiver to select a suitable algorithm for a function in the receiver in accordance with said determined signal quality; and
   causing a digital radio mondiale broadcast receiver to apply said selected algorithm to the received radio signal, wherein said selected algorithm is scalable, and wherein said algorithm is applied in accordance with said determined signal quality, by scaling said algorithm in accordance with said determined signal quality, wherein the algorithm comprises a decoding algorithm and said received digital radio mondiale broadcast signal is always coded with the same coding method, wherein the decoding provides identical decoding results or at least similar decoding results within an error tolerance of the digital radio mondiale broadcast receiver.

10. Software digital radio mondiale broadcast receiver comprising:
   reception unit for receiving a digital radio mondiale broadcast signal, said digital radio mondiale broadcast signal being in accordance with the digital radio mondiale standard;
   a signal quality determining stage connected to said reception unit for determining the signal quality of said received digital radio mondiale broadcast signal;
   an algorithm selection stage, connected to said signal quality determining stage, for selecting an algorithm for a function in the receiver to be applied to said received digital radio mondiale broadcast signal; and
   an algorithm application stage, connected to said reception unit and to algorithm selection stage, configured to apply said algorithm for a function in the receiver to said received digital radio mondiale broadcast signal selected by said algorithm selection stage in accordance with said determined signal quality, and wherein said algorithm application stage uses a scalable algorithm, and that the scale of said algorithm is selected in accordance with said determined signal quality, wherein the algorithm comprises a decoding algorithm and said received digital radio mondiale broadcast signal is always coded with the same coding method, wherein the decoding provides identical decoding results or at least similar decoding results within an error tolerance of the digital radio mondiale broadcast receiver.

11. Software digital radio mondiale broadcast receiver according to claim 10, characterized in that said algorithm is an error correction algorithm.

12. Software digital radio mondiale broadcast receiver according to claim 10, further comprising an algorithm storage connected to said algorithm application stage, for storing a number of different algorithms with different processing properties and for selecting a suitable algorithm to be executed by the algorithm application stage.

13. Software digital radio mondiale broadcast receiver according to claim 10, characterized in that said signal quality determining stage determines a signal-to-noise-ratio of said received digital radio mondiale broadcast signal.

14. Software digital radio mondiale broadcast receiver according to claim 10, characterized in that said signal quality determining stage determines a Channel State Information of said received digital radio mondiale broadcast signal.

15. Software digital radio mondiale broadcast receiver according to claim 10, further comprising a short range communication transceiver connected to said algorithm application stage for sending said decoded digital radio mondiale broadcast signal via a short range communication channel to a device.

16. Software digital radio mondiale broadcast receiver according to claim 10, further comprising a mobile telephone.

17. Software digital radio mondiale broadcast receiver according to claim 10, wherein the algorithm selection stage uses different algorithms according to said determined signal quality and a required power consumption.

18. Software digital radio mondiale broadcast receiver according to claim 10, characterized in that said algorithm application stage uses different algorithms according to said determined signal quality.

19. Software digital radio mondiale broadcast receiver comprising:
reception means for receiving a digital radio mondiale broadcast signal, being in accordance with the digital radio mondiale standard;
signal quality determining means connected to said reception means for determining the signal quality of said received digital radio mondiale broadcast signal;
algorithm selection means, connected to said signal quality determining means, for selecting an algorithm for a function in the receiver means to be applied to said received digital radio mondiale broadcast signal and
algorithm application means, connected to said reception means and to said algorithm selection means, for applying said algorithm for a function in the receiver means to said received digital radio mondiale broadcast signal selected by said algorithm selection means in accordance with said signal quality determined by said signal quality determining means, wherein said algorithm application means uses a scalable algorithm, and wherein the scale of said algorithm is selected in accordance with said determined signal quality, wherein the algorithm application means comprises a decoding algorithm application means and said received digital radio mondiale broadcast signal is always coded with the same coding method, wherein the decoding provides identical decoding results or at least similar decoding results within an error tolerance of the digital radio mondiale broadcast receiver.

20. An apparatus comprising:
a processor configured to determine a signal quality of a received digital radio mondiale broadcast signal being received in accordance with the digital radio mondiale standard;
wherein the processor is also configured to select an algorithm for a function in a software digital radio mondiale broadcast receiver to be applied to said received digital radio mondiale broadcast signal;
wherein the processor is further configured to apply said algorithm for a function in the receiver that has been selected to said received digital radio mondiale broadcast signal in accordance with said determined signal quality, and wherein the processor is configured to scale the algorithm in accordance with said determined signal quality, and
wherein the algorithm comprises a decoding algorithm and said received digital radio mondiale broadcast signal is always coded with the same coding method, wherein the decoding provides identical decoding results or at least similar decoding results within an error tolerance of the digital radio mondiale broadcast receiver.

21. An apparatus according to claim 20, wherein said algorithm comprises an error correction algorithm.

22. An apparatus according to claim 20, further comprising an algorithm storage operably connected to said processor, configured to store a number of different algorithms with different processing properties and to select a suitable algorithm to be applied by the processor.

23. An apparatus according to claim 20, wherein the processor is further configured to determine a signal-to-noise-ratio of said received digital radio mondiale broadcast signal that is indicative of the signal quality.

24. An apparatus according to claim 20, wherein the processor is further configured to determine a Channel State Information of said received digital radio mondiale broadcast signal that is indicative of the signal quality.

25. An apparatus according to claim 20, wherein the processor is configured to select and apply different algorithms further according to a required power consumption.

26. An apparatus according to claim 20, wherein the processor is configured to select and apply different algorithms according to said determined signal quality.

* * * * *